US008609556B2

(12) United States Patent
Van Gerwen et al.

(10) Patent No.: US 8,609,556 B2
(45) Date of Patent: Dec. 17, 2013

(54) THIN FILM DEPOSITION APPARATUS WITH AN EXPANDING THERMAL PLASMA SOURCE AND METHOD FOR DEPOSITING A THIN FILM USING THE SAME

(75) Inventors: Björn Van Gerwen, Veldhoven (NL); Roland Cornelis Maria Bosch, Eindhoven (NL); Franciscus Cornelius Dings, Arendonk (BE)

(73) Assignee: OTB Solar B.V., Eindhoven (NL)

( * ) Notice: Subject to any disclaimer, the term of this patent is extended or adjusted under 35 U.S.C. 154(b) by 0 days.

(21) Appl. No.: 13/496,820

(22) PCT Filed: Sep. 17, 2010

(86) PCT No.: PCT/NL2010/050604
§ 371 (c)(1),
(2), (4) Date: May 15, 2012

(87) PCT Pub. No.: WO2011/034429
PCT Pub. Date: Mar. 24, 2011

(65) Prior Publication Data
US 2012/0220138 A1    Aug. 30, 2012

(30) Foreign Application Priority Data
Sep. 18, 2009 (NL) ...................................... 2003514

(51) Int. Cl.
*H01L 21/31* (2006.01)
(52) U.S. Cl.
USPC ................................... 438/791; 257/E21.293
(58) Field of Classification Search
USPC .......................... 438/791, 758, 778; 118/719; 257/E21.293
See application file for complete search history.

(56) References Cited

U.S. PATENT DOCUMENTS

| 4,871,580 | A | 10/1989 | Schram et al. |
| 6,397,776 | B1 | 6/2002 | Yang et al. |
| 2006/0057755 | A1* | 3/2006 | Weber .............................. 438/48 |
| 2007/0269612 | A1* | 11/2007 | Bijker et al. ................... 427/569 |
| 2009/0101202 | A1* | 4/2009 | Sun et al. ....................... 136/256 |

FOREIGN PATENT DOCUMENTS

| EP | 1365040 A1 | 11/2003 |
| JP | 4-083796 A | 3/1992 |

OTHER PUBLICATIONS

International Search Report for PCT International Patent Application No. PCT/NL2010/050604, mailed Nov. 5, 2010.

(Continued)

*Primary Examiner* — Kimberly Rizkallah
*Assistant Examiner* — Duy T Nguyen
(74) *Attorney, Agent, or Firm* — Pillsbury Winthrop Shaw Pittman LLP

(57) ABSTRACT

Assembly and method for depositing a thin film including: providing an expanding thermal plasma plume, including at least one chemical component to be deposited; designating a first and a second deposition zone within the plasma plume, such that the first and second deposition zones have a mutually different relative content of the chemical component; providing a substrate, and transporting said substrate through the plasma plume along a substrate transport path having a substrate transport path direction; and providing a mask that is at least partly disposed in the plasma plume and that shields a portion of the substrate transport path from being deposited on, wherein said shielded portion of the substrate transport path extends in the direction of the substrate transport path and bridges at least the first deposition zone, while it starts or terminates in the second deposition zone.

7 Claims, 2 Drawing Sheets

(56) References Cited

OTHER PUBLICATIONS

International Preliminary Report on Patentability for PCT International Patent Application No. PCT/NL2010/050604, mailed on Sep. 9, 2011, including Response to the International Search Report and Written Opinion.

* cited by examiner

THIN FILM DEPOSITION APPARATUS WITH AN EXPANDING THERMAL PLASMA SOURCE AND METHOD FOR DEPOSITING A THIN FILM USING THE SAME

This application is the National Phase of PCT/NL2010/050604, filed Sep. 17, 2010, which claims priority to Netherlands Application No. 2003514, filed Sep. 18, 2009, the entire contents of both applications being incorporated herein by reference in their entireties.

FIELD OF THE INVENTION

The present invention relates to the field of thin film deposition by means of plasma-enhanced chemical vapor deposition (PECVD), and, more particularly, thin film deposition by PECVD using expanding thermal plasma.

BACKGROUND

Over the past years, hydrogenated silicon nitride ($SiN_x$:H) has found widespread application in the production of high-efficiency solar cells. This is due to its capability to accomplish several functions at the same time, which simplifies the fabrication process, for example.

In a typical commercial silicon solar cell production sequence, a thin layer of hydrogenated silicon nitride of about 100 nm is deposited on an n-p junction by a plasma-enhanced chemical vapor deposition process. The silicon nitride layer not only serves as an anti-reflection coating, but also effects an accumulation of positive charge at the $SiN_x$:H—Si interface that aids in surface passivation. Furthermore, it introduces hydrogen into the silicon of the cell which resides within a thin plasma-damaged surface layer. Following the deposition of $SiN_x$:H, metal contacts may be screen printed and fired through the anti-reflection coating. The metal hereby penetrates the coating to form a low-resistance ohmic contact, while the hydrogen diffuses into the bulk of the cell to passivate impurities and defects. The multi-purpose role of the hydrogenated nitride layer thus requires it to be a low-absorption anti-reflective coating, serve as a barrier for control in metallization, and promote favorable electronic processes that can passivate the surface as well as the bulk of the cell. It is therefore of vital importance that the deposition process of $SiN_x$:H is designed carefully, so as to optimize the optical and electronic properties of the solar cell.

PECVD may be performed using a variety of techniques, such as, for example, Inductively Coupled Plasma (ICP) and Expanding Thermal Plasma (ETP). ETP-sources have proven to be an excellent choice for the deposition of thin, dense and high quality $SiN_x$:H layers at deposition speeds of tens of nanometers per second. Research has revealed, however, that films that are deposited on substrates by straightforwardly moving them through the plasma plume of an ETP-source typically exhibit less than optimal optical and electronic characteristics.

It is therefore beneficial to provide an ETP-based thin film deposition assembly and a method that are capable of depositing layers, such as, for example, the aforementioned anti-reflective coatings, having improved optical and/or electronic properties.

SUMMARY OF THE INVENTION

According to one aspect of the invention, a thin film deposition assembly is provided. The thin film deposition assembly includes a deposition chamber, including at least one expanding thermal plasma (ETP) source. The ETP-source is configured to produce a plasma plume shaving a number of deposition zones. Each deposition zone has a relative composition of chemical components that is different from adjacent deposition zones. The thin film deposition assembly also includes a substrate transport system, configured to transport at least one substrate through the plasma plume along a substrate transport path. The substrate transport path has a substrate transport path direction. The thin film deposition assembly further includes a mask. The mask is at least partly disposed in the plasma plume during operation and shaped to shield a portion of the substrate transport path from being deposited on. The mask extends in a downstream or upstream half of the plasma plume. The shielded portion of the transport path extends in the direction of the substrate transport path and bridges (in this direction) at least a first deposition zone, while an (upstream or downstream) extremity of said shielded portion is located in a second deposition zone.

According to another aspect of the present invention, a method for depositing a thin film is provided. The method includes: providing an expanding thermal plasma plume, including at least one chemical component to be deposited; providing a substrate, and transporting said substrate through the plasma plume along a substrate transport path having a substrate transport path direction; and providing a mask that is at least partly disposed in the plasma plume and that shields a portion of the substrate transport path from being deposited on. The method further includes: designating at least a first and a second deposition zone within the plasma plume, such that the first and second deposition zones have a mutually different relative content of the chemical component. The mask extends in an upstream or downstream half of the plasma plume, and the shielded portion of the substrate transport path extends in the direction of the substrate transport path and bridges (in this direction) at least the first deposition zone, while an (upstream or downstream) extremity of said shielded portion is located in a second deposition zone. During transport along the substrate transport path, the substrate crosses the shielded portion of the substrate transport path.

It has been found that the chemical composition of a plasma plume generated by an ETP-source, such as, for example, a cascaded arc plasma source, varies spatially. In a crude, simplified conception, the plasma plume may be thought of as a conically-shaped plasma environment, having its vertex near a plasma outflow opening of the ETP-source and its base on the substrate transport path. Seen from a central axis of the conically-shaped plume outward, the relative chemical composition of the plasma environment changes.

In this simplified conception, the plume may thus be said to have concentrically arranged zones, each having a certain relative chemical composition that is different from neighboring zones. A certain zone is responsible for depositing a portion of a layer or film having a composition that reflects its respective chemical composition. Hence their designation as 'deposition zones'.

The present invention is motivated by the realization that some deposition zones have a more favorable composition than others, in particular in relation to certain portions of the layer to be deposited. For example, as explained above, in silicon solar cells a lower (i.e. first-deposited) portion of a silicon nitride anti-reflective coating is preferably rich in hydrogen. It is therefore preferable to shield a substrate that is being carried into the plasma plume from deposition by deposition zones having a low hydrogen content, and to first expose the substrate when it reaches a deposition zone that is rich in hydrogen. In a practical setup, the inner core of the plasma plume may contain the highest levels of hydrogen (or generally: have a relatively favorable chemical composition that results in the desired layer properties). In such a case, the mask may be used to bridge the outer deposition zone(s), that is: to shield the substrate transport path from deposition by the outer deposition zone(s) by casting a protective shadow thereon. This enables a substrate to be transported into the core of the plume (corresponding to an inner deposition zone) first without being subjected to deposition from the outer deposition zones: as the substrate travels through these outer zones, it travels in the shadow of the mask. The mask thus provides for spatial control over the deposition environment to which a substrate is exposed. Incidentally, such spatial control, which may be advantageously employed in high-throughput in-line processing lines (wherein the substrates are mobile), must be distinguished from temporal changes in the deposition atmosphere itself, which are common in batch processes (wherein substrates are stationary).

It is noted that the meaningful designation and delimitation of deposition zones is not absolute, but based on the application at hand and the spatial chemical composition and geometry of the plasma plume. Generally, the relative chemical composition of a plasma plume (including, for example, the relative hydrogen content) may vary continuously across a plasma plume, and thus throughout finite regions thereof. Yet deposition zones may be meaningfully defined, for example by means of spatial averages or ranges of relative contents (e.g. relative contents in hydrogen, nitrogen and/or silicon) that differ from that of neighboring deposition zones. Such ranges of relative contents that define a respective deposition zone may be chosen as desired, whereby the range limits may typically be established through theoretical calculations or experiments. A deposition zone may for example be defined as a region of the plasma plume having at least x % hydrogen content and between y % and z % nitrogen content, whereby the numbers x, y and z are selected based on the application at hand. Further, cascaded ETP-sources typically generate a plasma plume having a relatively well-defined and symmetric chemical composition, which makes them particularly suited for use with a mask as described. Still, even in case cascaded ETP-sources are employed, asymmetries in the spatial distribution of chemical components may arise, for example from interference between neighboring ETP-sources or interaction with walls or other structures within the deposition chamber. In such cases the shapes and boundaries of deposition zones, and hence the desired form of the mask, may not be easily determinable, and recourse to experimental trial-and-error may be the way to go about. It is noted that different deposition zones may differ in more than just their chemical composition; they may, for example, also differ in (average) temperature or density.

One skilled in the art will appreciate that the present invention is not limited to the deposition of $SiN_x$:H layers in solar cell fabrication, and that it is applicable to a wide range of ETP-based thin film deposition processes, such as silicon oxide ($SiO_x$) or amorphous-Si deposition. In each case, the mask may be used to shield a portion of the substrate transport path—and thus a portion of a substrate crossing said shielded portion of the substrate transport path as it is transported downstream thereof—from deposition by selected portions of a number of deposition zones. The shielded portion of the substrate transport path may thereby extend between an (upstream) outside of the plasma plume and a (downstream) deposition zone, between two deposition zones within the plasma plume, or between an (upstream) deposition zone and a (downstream) outside of the plasma plume, as long as it extends through at least one deposition zone whose contribution to the deposition process, at that point along the substrate transport path, is undesired.

According to one embodiment of the thin film deposition assembly according to the present invention, the first deposition zone is a peripheral deposition zone, located on the outside of the plasma plume.

A peripheral deposition zone is understood to be an outlying deposition zone, bounded in part by the outer circumference of the plasma plume, and thus at least partly bounded by a region of space that is outside of the influence of the plasma plume. In case the plasma plume has a number of deposition zones having a substantially concentric (not necessarily circular, e.g. elliptical) cross-section, a peripheral zone would encircle at least one other deposition zone. Since peripheral deposition zones are prone to having an unbalanced chemical composition, it may often be desirable to prevent them from contributing to a new layer, or at least from rendering a first contribution. Bridging a peripheral deposition zone by means of the mask may enable substrates to be brought into or out of the core of the plasma plume without first being exposed to the peripheral zone.

According to another embodiment of the thin film deposition assembly, the shielded portion of the substrate transport path bridges a portion of the first deposition zone that is disposed upstream of a portion of the second deposition zone, in which latter portion the shielded portion of the substrate transport path terminates.

The bridging of one or more upstream deposition zones (relative to one or more downstream zones; upstream and downstream designations relating to a transport direction of the substrates along the substrate transport path) may be desired in case the composition of the first-deposited portion of a layer is of paramount importance, and the upstream zones have a relative chemical composition that is less favorable than more downstream zones. A case in point is, again, the aforementioned situation wherein a silicon substrate is preferably disposed first to a hydrogen-rich central deposition zone of the plasma plume, which means that a portion of a peripheral deposition zone, upstream of the central zone, must be bridged. It is understood that applications other than the exemplary solar cell may not have a preference for a first-deposited layer portion that is rich in hydrogen, but a preference for a first layer that is rich in some other substance.

According to a further embodiment, the mask is a plate-like member. The mask may for example be manufactured economically from a metal plate, and shaped as desired using conventional techniques. In an advantageous elaboration, the mask may extend across the substrate transport path, having an upstream edge and a downstream edge, the downstream edge having a profile of one or more projections that extend into the plasma plume during operation so as to shield equally many portions of the substrate transport path from being deposited on. Such a mask is effective, economically manufacturable, and enables width-wise juxtaposed portions of the substrate transport path to be shielded in agreement with the precise local shape of the deposition zones. Having multiple projections has proven to be especially useful in situation wherein multiple ETP-sources interfere with each other in a somewhat erratic manner.

Indeed, by analogy with the above-described situations wherein only one ETP-source is present, the invention is also applicable to thin film deposition assemblies having multiple ETP-sources. In such a case, the different ETP-sources may each produce a plasma plume, whereby two or more of said plasma plumes may overlap or interact to form a compound plasma plume or plasma environment that has several deposition zones. Multiple ETP-sources may be disposed next to each other (seen in a direction transverse to the substrate transport path), e.g. to widen the substrate transport path so as to enable the processing of wider substrates, or be disposed in succession (seen in the substrate transport path direction). ETP-sources that are arranged in succession need not produce identical plasma plumes; in fact, they may differ advantageously, for example in overall relative chemical composition, plasma flow rate, overall plasma density, and the manner in which the plasma plumes are masked to shield portion of the substrate transport path, whereby variations between successive plasma plumes may in particular serve to create a thin film having a stratified or otherwise desired structure. For example, an upstream ETP-source, possibly provided with a mask, may provide for deposition of a first portion of a thin film to be deposited, while a downstream ETP-source, which may also be provided with a suitable mask, may provide for deposition of a second portion of said thin film. The number of successive ETP-sources is freely selectable, and subject to the requirements on the film to be deposited. The precise structure of the stratification, e.g. the hydrogen gradient, the density profile and the thickness of inner layers of the thin film, may be controlled accurately by adjusting the process settings of the ETP-sources (and therewith the aforementioned characteristics of the plasma plumes) and employing masks as described above.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
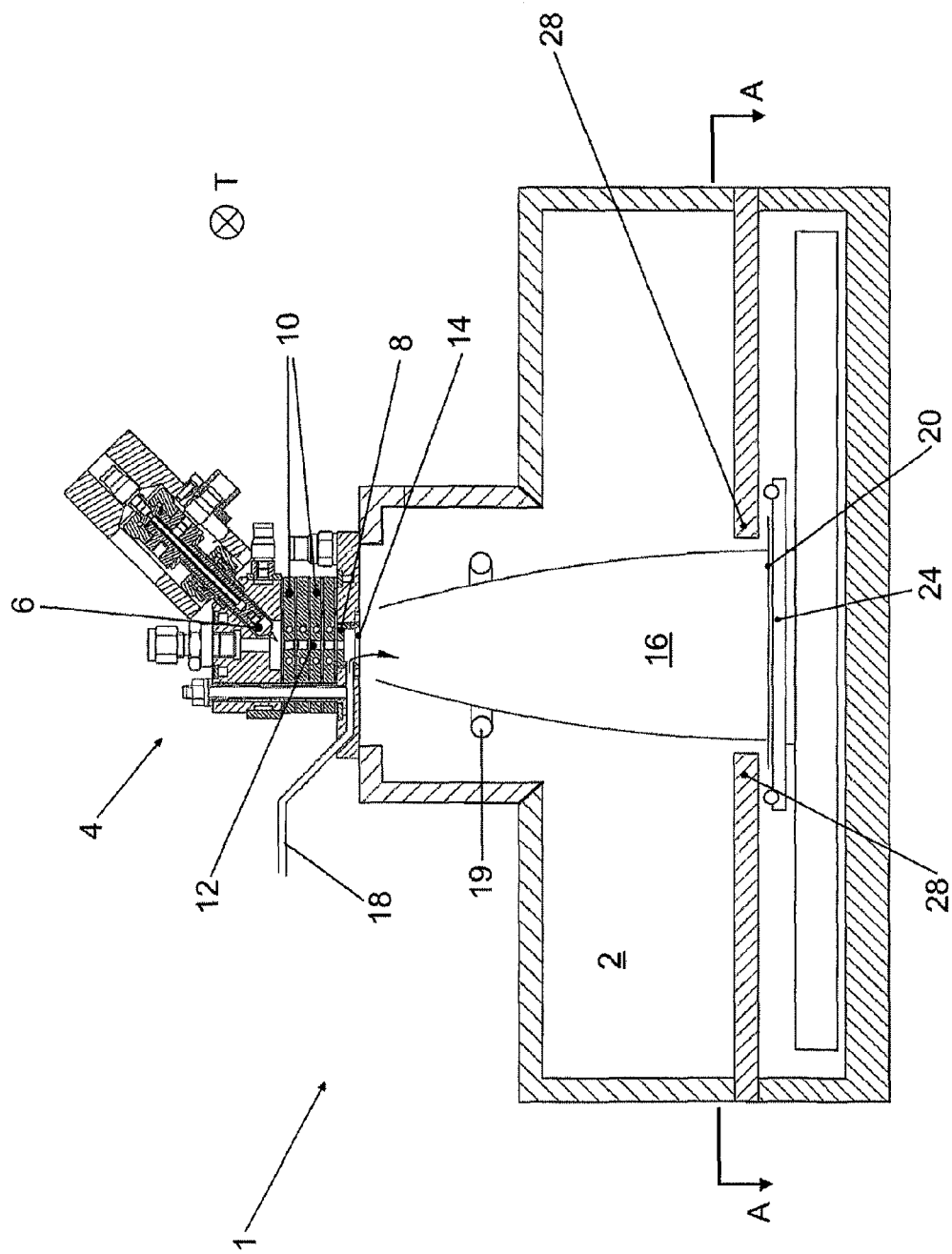
FIG. 1 is a schematic cross-sectional back side view of a known thin film deposition assembly based on a cascade ETP-source.
Figure 2:
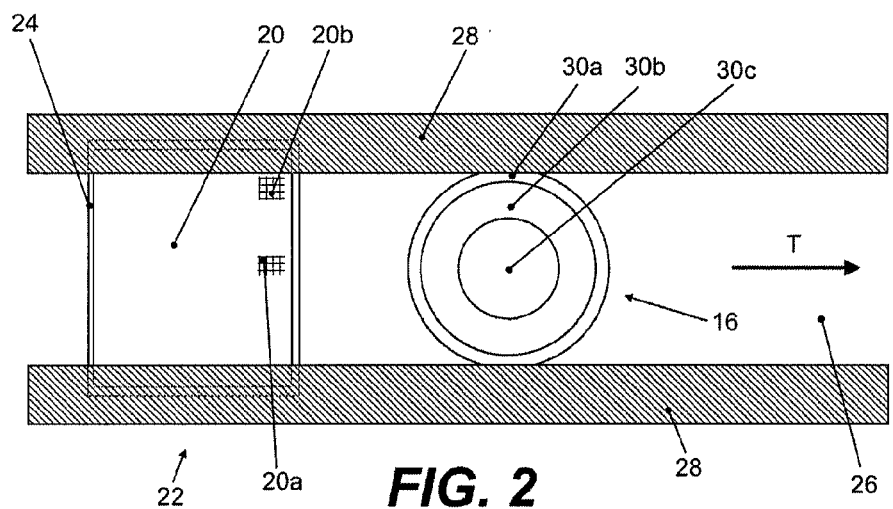
FIG. 2 is a schematic cross-sectional top view of the setup shown in FIG. 1, seen along section A-A.

FIG. 1 is a schematic cross-sectional back side view of a known thin film deposition assembly 1 (back side, because the transport direction T points perpendicularly into the plane of the drawing). FIG. 2 is a schematic cross-sectional top view of the same assembly 1, seen along section A-A indicated in FIG. 1. The thin film deposition assembly 1 is provided with a conventional low-pressure PECVD deposition chamber 2 on which a high-pressure, DC (direct current) cascaded arc plasma source 4 is mounted. The basic operation of such a plasma source 4 is described in some detail in, for example, U.S. Pat. No. 4,871,580, in the name of the University of Technology of Eindhoven (The Netherlands), which is incorporated by reference herein in its entirety, and will be dealt with here only briefly. The plasma source 4 includes an elongate plasma channel 12, bounded by mutually insulated and water-cooled cascade plates 10. A cathode 6 is present at an entrance side of the plasma channel 12, while an anode 8 is provided at an exit side, proximal to the deposition chamber 2. A DC power supply (not shown) connected to both the cathode 6 and the anode 8 controls the discharge of the cascaded arc. Normally, the plasma source 4 is operated at high flows, e.g., several standard liters per minute, of typically non-depositing (yet sometimes depositing) gases, such as, for example, Ar, Ar—$N_2$, $H_2$, $N_2$, etc., leading to pressures of approximately several tenths of bars when the plasma is ignited. However, such a high flow is not meant to be limiting. In the plasma, reactive species are created that can be used for downstream precursor gas dissociation. The plasma emanates from the cascaded arc plasma source 4 through a nozzle 14 in the anode 8 and expands into the deposition chamber 2, provided at a different pressure than that of the plasma source 4. In an embodiment, the deposition chamber 2 is at a pressure of approximately several tenths of millibars. Due to the large difference in the pressures that are present in the plasma source 4 and the deposition chamber 2, the plasma is accelerated to a supersonic expansion. At approximately few centimeters from the nozzle 6, for example, a stationary shock occurs, after which the plasma expands subsonically to form a reasonably well-defined directional plasma plume 16. Depending on the gas mixtures used, the cascaded arc plasma source 4 can deliver large flows of several types of reactive ionic and atomic species, such as, for example, Ar+, H, N, etc.

The cascaded arc plasma source 4 may be further provided with two gas injection channels 18, 19 that are configured to insert one or more desired precursor gases into the plasma. Any molecular precursor gases injected into the plasma will be dissociated, and carried away by the expanding plasma plume 16 for deposition. The gas injection channel 18, as depicted in FIG. 1, ends in the anode 8 of the plasma source 4, and may, therefore, in accordance with an embodiment, be considered an integral part thereof. The gas injection channel may take the form of an injection ring or shower head 19, disposed at a distance below the nozzle 14, through which the expanding plasma plume passes. For the purpose of depositing a hydrogenated silicon nitride ($SiN_x$:H) film, ammonia ($NH_3$) may be injected through gas injection channel 18 while silane ($SiH_4$) may be injected into the plasma via injection ring 19. In this text, gas injection channels for the purpose of injecting (precursor) gases into the plasma are considered part of the plasma source, irrespective of where exactly their injection points are located.

Deposition from the plasma plume 116 takes place on substrates 20, which are transported in a transport direction T along a substrate transport path 26 by a substrate transport system 22. The substrate transport path 26 runs through the deposition chamber 2, and through the (base of the) plasma plume 16. Although the substrate transport path 26 is depicted as being straight, it is contemplated that a substrate transport path may have any desired different shape, such as round or meandering, and at each point have a transport direction T that is determined by the local direction of the path. The substrate transport system 22 may comprise a number of moveable substrate carriers 24, each for supporting one or more substrates 20. It may be of any suitable type, and, for example, form an implementation of the magnetic drive system described in EP 1,365,040, a European patent in the name of applicant, which is incorporated by reference herein in its entirety. For reasons of clarity, FIGS. 1 and 2 show merely one substrate 20 supported by one substrate carrier 24, whereby, as can be seen in FIG. 2, the substrate 20 is located upstream of the plasma plume 16. It is understood, however, that in a practical situation several substrate carriers 24, each of which may carry multiple substrates 20, may move along the substrate transport path 26 in close succession, so as to provide for a high-throughput in-line deposition assembly.

The known thin film deposition assembly 1 features a mask 28. This mask 28 extends alongside the substrate transport path 26, on both sides thereof, and primarily aims to prevent deposition on the sides of the substrate carrier 24 as it passes through the plasma plume 16.

FIG. 2 also illustrates the division of the plasma plume 16 in deposition zones 30. In total, three exemplary deposition zones 30a, 30b, 30c have been drawn. It must be stressed, however, that the existence and effects of such deposition zones 30 in the expanding thermal plasma plume 16 were not previously acknowledged, and as such, they do not belong to the known technology outlined here. The deposition zones 30 are shown in FIG. 2 to illustrate what may happen when a substrate 20 is transported through the plasma plume 16. Two patches of substrate surface area have been marked, respectively 20a and 20b. Both patches 20a and 20b reside near the leading edge of the substrate 20, whereby the surface patch 20a is located about halfway the leading edge, while the surface patch 20b is located more towards the side. As the substrate 20 enters the plasma plume 16, its leading edge is first exposed to the peripheral deposition zone 30a. The first portion of the thin film layer deposited on the substrate 20, and hence on surface patches 20a and 20b, is thus deposited from this zone 30a. When the substrate 20 moves ahead in the transport direction T, surface patch 20a is further consecutively exposed to deposition zones 30b, 30c, 30b and 30a, while surface patch 20b is consecutively disposed to a combination of deposition zones 30a+30b (it travels through these two zones at the same time), and then to deposition zone 30a.

There are several points worth making about this example. Firstly, since the deposition zones 30a, 30b, 30c are characterized by a mutually different relative chemical composition, the thin film deposited on each of the surface patches 20a, 20b will be internally stratified, or at least exhibit gradients in chemical composition. For many applications this is not a significant issue as long as the parameters of the stratification, e.g. the order of differently composed layers, can be controlled. Secondly, as patches of substrate surface area 20a, 20b do not travel through the same sequence of deposition zones, the thin film deposited on the surface patch 20a will have a different stratification pattern than the thin film deposited on the surface patch 20b. A thin film having a different structure and chemical composition across a substrate is typically undesired, and the condition may be indicative of varying film properties, and hence less than optimal properties at at least some locations. Thirdly, it should be recognized that one deposition zone may comprise a more favorable composition of chemical components than another. Accordingly, it may be desirable to eliminate one or more deposition zones having a less favorable composition from the deposition process in order to optimize the eventual composition of the thin film, and thus its optical and electronic properties.

Several approaches to eliminating unfavorable deposition zones are conceivable. Some of them may involve redesigning the cascaded arc plasma source to optimize the spatial configuration of deposition zones within the generated plasma plume, which is a rather elaborate process. The present invention proposes an alternative and more cost effective solution. A mask may be employed to shield a substrate from one or more deposition zones as it passes through the plasma plume.

The mask may be used to substantially block out certain deposition zones completely, or to determine the order in which a substrate (or substrate surface patch) is exposed to the different zones.

Figure 3:
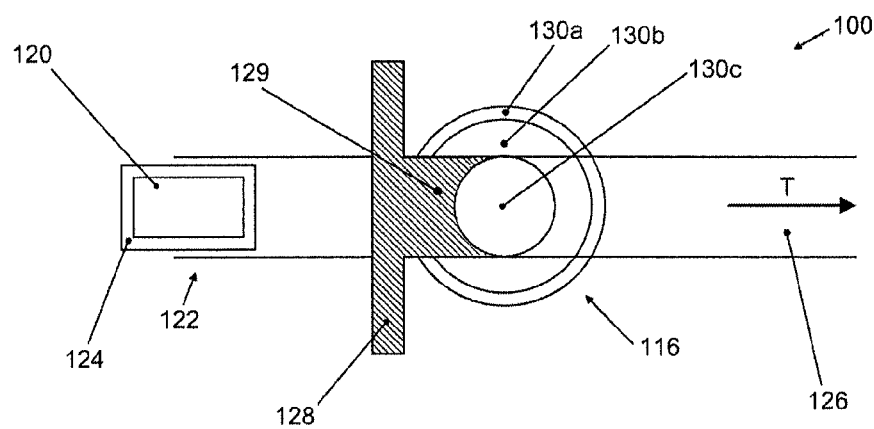
FIG. 3 is a schematic cross-sectional top view of an exemplary thin film deposition assembly according to the present invention.
Figure 4:
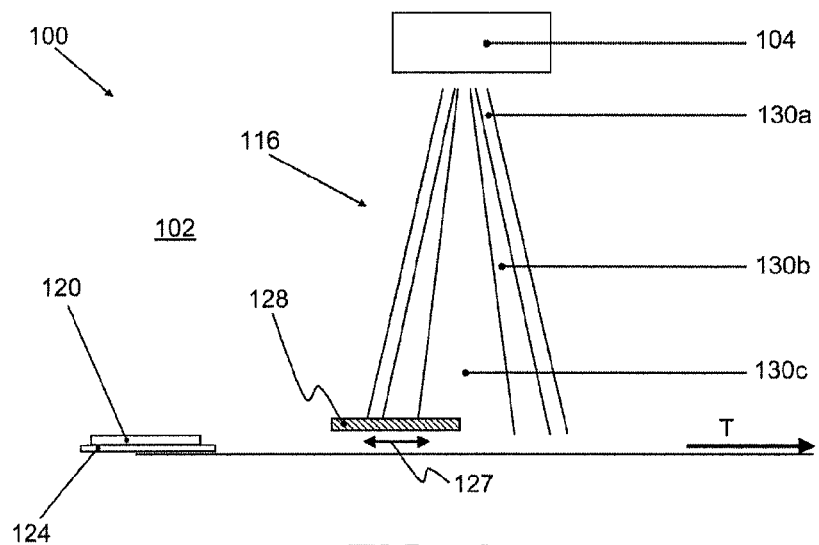
FIG. 4 is a schematic cross-sectional side view of the exemplary thin film deposition assembly shown in FIG. 3.

By way of example, a thin film deposition assembly 100 according to the present invention is schematically depicted in FIGS. 3 and 4. This thin film deposition assembly 100 is in some respects similar to the assembly 1 discussed with reference to FIGS. 1 and 2, and thus reference may be made to such features throughout the description. In addition, some differences and improvements are discussed below.

Thin film deposition assembly 100 may be configured to deposit a layer of hydrogenated silicon nitride ($SiN_x$:H) on top of a substrate 120, which substrate may already have been treated to comprise an n-p junction on which the nitride layer may be grown. Deposition may take place from an expanding thermal plasma plume 116 that is generated through a high-pressure, DC cascaded arc plasma source 104, which may be similar to the one shown in more detail in FIG. 1. Ammonia ($NH_3$) and silane ($SiH_4$) may be used as precursor gases, and injected into the plasma as it exits the plasma channel of the source 104. Research has revealed that a central deposition zone of the plasma plume 116, marked 130c in FIGS. 3 and 4, may comprise a more favorable relative chemical composition of silicon (Si), hydrogen (H) and (N) that results in the deposition of a layer portion that fulfills the requirements set out in the background section above. Deposition zones 130a and 130b, on the other hand, may have a lesser favorable relative chemical composition, insufficient to form the boundary between the n-p junction of the substrate 120 and the bulk of the hydrogenated silicon nitride layer to be grown. The chemical composition of the latter deposition zones 130a, 130b may, however, suffice for forming the bulk itself. Accordingly, the aim is to ensure that the first deposition zone to which the substrate 120 is exposed is deposition zone 130c, while later contributions to the nitride layer may be provided by deposition zones 130a, 130b.

To this end, in accordance with an embodiment, a mask 128 is provided. The mask 128, which may be formed as a plate-like member, may comprise a base portion that extends transverse to the direction T of the substrate transport path 126 and across said transport path 126. The mask 128 may further comprise at least one projection 129 that is connected to the base portion, and that extends into the plasma plume 116, here at least partially in the direction T of the substrate transport path 126. The at least one projection 129 may be shaped to shield a portion 127 of the substrate transport path 126 from being deposited on by the outer, upstream portions of deposition zones 130a, 130b of the plasma plume 116. The at least one projection 129 may thus, in an embodiment, extend through upstream portions of both outer zones 130a, 130b, and terminate in the central zone 130c. In an embodiment, the downstream edge of the projection 129 may be shaped in agreement with the upstream contour of deposition zone 130c, so as to maximize the overall exposure of the substrate 120 to this zone. That is, the downstream edge of the mask 128, including the profile of the at least one projection 129, may be at least partially curved, preferably in agreement with the (here: elliptically, more in particular, circularly) curved upstream contour of deposition zone 130c.

In case the mask 128 features more than one projection 129, each projection may shield a portion of the substrate transport path 126 from being deposited on. In an embodiment, the projections 129 need not be identical in shape; in fact, depending on the configuration of the plasma plume 116, they may be quite distinct. Each projection 129 may, for example, have a shape that is irregular or ragged, depending on the (local) shape of the deposition zone to be blocked. A projection 129 may typically include one or more curved (i.e. not-straight) edge portions. It is understood that different projections 129 may block out (portions of) different deposition zone(s); that is: the projections 129 need not all relate to the same deposition zone(s).

As mentioned, it may be a purpose of the mask 128 to ensure that a substrate 120 that is being transported in the direction T along the substrate transport path 126 is first deposited on by the central deposition zone 130c, and to allow subsequent deposition from more downstream deposition zones 130b, 130a. To accomplish this, the mask 128 may extend entirely in an upstream half of the plasma plume 116, as shown in FIGS. 3 and 4, wherein the upstream half may be defined as the part upstream of a line extending through the geometrical center of the plume 116, and in a direction perpendicular to the direction T of the transport path 126. Accordingly, the mask 128 according to this aspect of the invention may be referred to as a 'half-mask'. As a concept the 'half-mask' is to be distinguished from a mask that extends through an entire plasma plume, having one or more holes in it to provide for equally many 'deposition windows'. Such a latter mask may normally block deposition from deposition zones located upstream and downstream of a hole, and thus cause deposition material, for example having a chemical composition suitable for building the bulk the layer or film to be grown, to be wasted. With regard to the terminology used here, it is noted that a hole may be said to be defined and bound by an 'internal edge' of the mask, while the terms 'upstream edge' and 'downstream edge' may generally be construed as outer, circumferential edges or edge portions that bound the mask 128.

As one skilled in the art will appreciate, the use of a 'half mask' is not limited to an upstream half of a plasma plume. In an embodiment, a half mask may alternatively or also be applied in the downstream half of a plasma plume, for example, to control the structure/chemical composition of the upper part of a film to be grown. Such a downstream half mask may then include an upstream and a downstream edge, wherein the upstream edge (upstream with respect to the transport direction T) may comprise a profile of one or more projections that, during operation, extend into the plasma plume and that are shaped to shield an equal number of portions of the substrate transport path from being deposited on.

According to a further embodiment, the thin film deposition assembly according to the present invention may include at least two ETP-sources. Seen in the transport direction T, the at least two ETP-sources may be arranged one after another, such that a first ETP-source is disposed upstream of at least a second ETP-source. In such an embodiment, a mask may be disposed at a position in between (e.g., the centers of) the plasma plumes produced by the at least first and second sources, so as to enable the mask to shield portions of the substrate transport path from being deposited on by deposition zones in either plume. For example, an upstream edge of the mask (upstream with reference to the substrate transport direction T) may include a profile of one or more projections that extend into the downstream half of the plasma plume of the first, upstream ETP-source and/or the downstream edge of the mask may include a profile with one or more projections that extend into the upstream half of the second, downstream ETP-source. Hence, the mask may serve as a half mask for both plasma plumes.

In a generalized embodiment, the invention may thus provide for a thin film deposition assembly, comprising a deposition chamber, including at least one ETP source. The ETP-source is configured to produce a plasma plume having a number of deposition zones. Each deposition zone has a relative composition of chemical components that is different from adjacent deposition zones. The assembly may further include a substrate transport system, configured to transport at least one substrate through the plasma plume along a substrate transport path having a substrate transport path direction. The assembly may also further include a mask. The mask is at least partly disposed in the plasma plume during operation and shaped to shield a portion of the substrate transport path from being deposited on. The mask extends in a downstream or upstream half of the plasma plume. The shielded portion of the transport path extends in the direction of the substrate transport path and bridges (in this direction) at least a first deposition zone, while an (upstream or downstream) extremity of said shielded portion is located in a second deposition zone. The mask may be a 'half mask' that extends in an upstream half and/or a downstream half of the plasma plume and that does not include any holes, at least not at positions located within the plasma plume during operation of the assembly. In an embodiment, the mask may have an upstream edge and/or a downstream edge, and wherein the upstream and/or downstream edge comprises a profile of one or more projections that, during operation, extend into the plasma plume and that are shaped to shield an equal number of portions of the substrate transport path from being deposited on. The edge(s) of the mask may include curved (i.e., not-straight) portions, which may 'follow' the shape of local deposition zones or deposition zone portions that are to be blocked. It is understood that the embodiments of the assembly described here are mutatis mutandis applicable to a method for depositing a thin film onto a substrate.

Referring again to FIGS. 3 and 4. The width of the projection 129, the width of the central zone 130c and the width of the substrate 120 have been tailored to each other such that the shielded portion 127 of the transport path 126 and the second deposition zone 130c each have a width that is substantially equal to or greater than a width of the substrate 120, said widths being measured transverse to the direction T of the transport path 126. This configuration allows the entire substrate 120 to be brought into the central zone 130c without exposition to the outer deposition zones 130a, 130b. Accordingly, the top surface of the substrate 120 may be first exposed to deposition zone 130c in one convenient rectilinear pass along the substrate transport path 126.

Comparison of FIGS. 2 and 3 illustrates differences between the known mask 28 and the mask 128 according to the present invention. The mask 128 fulfills a bridging function in the direction T of the substrate transport part 126. Mask 128 shields a portion 127 of the substrate transport path 126—and thus a portion of a substrate 120 crossing said portion 127 of the substrate transport path 126—from being deposited on by one or more selected deposition zones 130a, 130b whose boundaries have been established through calculation, modeling, and/or experiment. The known mask 28, in contrast, which was developed for an entirely different purpose and without relation to the concept of deposition zones 30 within a plasma plume 16, does not fulfill a bridging function. Though it extends in the substrate transport direction T, it does not connect a first deposition zone to a second deposition zone (or the surroundings of the plasma plume) so as to provide for a 'shadow bridge' across a third deposition zone disposed in between.

As one skilled in the art will appreciate, the embodiment of the thin film deposition assembly 100 illustrated in FIGS. 3 and 4 is merely exemplary. Many aspects may vary across different embodiments. These aspects include the cross-sectional shape of the plasma plume 116, which need not be circular, the number of plasma sources 104 (multiple sources may operate together to form a compound plasma plume or environment), the number and shape of meaningful designated deposition zones 130, the shape of the mask 128 and the number and shape of its individual protrusions 129, etc.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS

1 Known thin film deposition assembly
2 PECVD deposition chamber
4 Cascaded arc plasma source
6 Cathode
8 Anode
10 Cascade plates
12 Plasma channel
14 Nozzle
16 Plasma plume
18 Gas injection channel
19 Injection ring/shower head
20 Substrate
20a,b Patches of substrate surface area
22 Substrate transport system
24 Substrate carrier
26 Substrate transport path
28 Side edge mask
30 Deposition zones
. . . +100 Corresponding element of/in thin film assembly according to the present invention
127 Shielded portion of substrate transport path
128 Mask
129 Projection of mask
T Transport direction/Direction of substrate transport path

We claim:

1. A method for depositing a thin film comprising:
    providing an expanding thermal plasma plume, including at least one chemical component to be deposited;
    providing a substrate, and transporting the substrate through the plasma plume along a substrate transport path having a substrate transport path direction;
    providing a mask that is at least partly disposed in the plasma plume and that shields a portion of the substrate transport path from being deposited on, and
wherein the method further comprises:
    designating at least a first deposition zone and a second deposition zone within the plasma plume, such that the first and second deposition zones have a mutually different relative content of the chemical component, and
    wherein the mask merely extends in an upstream half or downstream half of the plasma plume;
    wherein the shielded portion of the substrate transport path extends in the direction of the substrate transport path and bridges at least the first deposition zone, while an extremity of said shielded portion is located in the second deposition zone, and
    wherein said substrate, during transport along the substrate transport path, crosses the shielded portion of the substrate transport path.

2. The method according to claim 1, wherein the mask extends across the substrate transport path, and wherein the mask has an upstream edge and a downstream edge, the upstream and/or downstream edge having a profile of one or more projections that extend into the plasma plume during operation so as to shield equally many portions of the substrate transport path from being deposited on.

3. The method according to claim 2, wherein the profile of the upstream and/or downstream edge of the mask is, at least partially, curved.

4. The method according to claim 1, wherein the first deposition zone substantially encircles the second deposition zone.

5. The method according to claim 1, wherein the shielded portion of the substrate transport path bridges a portion of the first deposition zone that is located upstream of a portion of the second deposition zone, in which latter portion the shielded portion of the substrate transport path terminates.

6. The method according to claim 1, wherein the shielded portion of the transport path and the second deposition zone are dimensioned such that they each have a width that is substantially equal to or greater than a width of the substrate, the widths being measured transverse to the direction of the transport path, thus allowing the substrate to be transported into or out of the second deposition zone without being exposed to the first deposition zone.

7. The method according to claim 1, wherein the thin film to be deposited is a hydrogenated silicon nitride ($SiN_x$:H) film, and wherein the designation of deposition zones is based on relative content of one or more of silicon (Si), nitrogen (N) and hydrogen (H).

* * * * *